US011563203B2

(12) United States Patent
Yug

(10) Patent No.: US 11,563,203 B2
(45) Date of Patent: Jan. 24, 2023

(54) METHOD OF FABRICATING DISPLAY DEVICE

(71) Applicant: Samsung Display Co., LTD., Yongin-si (KR)

(72) Inventor: Geunwoo Yug, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 199 days.

(21) Appl. No.: 17/152,151

(22) Filed: Jan. 19, 2021

(65) Prior Publication Data

US 2021/0391561 A1    Dec. 16, 2021

(30) Foreign Application Priority Data

Jun. 10, 2020   (KR) .................. 10-2020-0070565

(51) Int. Cl.
*H01L 51/56* (2006.01)
*H01L 51/52* (2006.01)
*H01L 51/00* (2006.01)

(52) U.S. Cl.
CPC .......... *H01L 51/56* (2013.01); *H01L 51/0097* (2013.01); *H01L 51/5237* (2013.01)

(58) Field of Classification Search
None
See application file for complete search history.

(56) References Cited

U.S. PATENT DOCUMENTS

| 10,608,209 | B2* | 3/2020 | Cheon ............... H01L 21/67092 |
| 10,665,642 | B2 | 5/2020 | Odaka et al. |
| 2011/0262663 | A1 | 10/2011 | Choi et al. |
| 2019/0088909 | A1* | 3/2019 | Cheon ................. H01L 27/3276 |
| 2020/0373189 | A1* | 11/2020 | Kim ..................... H01L 21/6838 |

FOREIGN PATENT DOCUMENTS

| JP | 2019-61130 | 4/2019 |
| KR | 10-0357949 | 10/2002 |
| KR | 10-1042213 | 6/2011 |

\* cited by examiner

*Primary Examiner* — J. E. Schoenholtz
(74) *Attorney, Agent, or Firm* — Kile Park Reed & Houtteman PLLC

(57) ABSTRACT

A display device fabrication method includes providing a substrate including a display panel including a panel mark, placing a processing module on the display panel, the processing module including a processing mark and a first processing line adjacent to the processing mark, the processing mark corresponding to the panel mark of the display panel, calculating an offset between the panel mark and the processing mark, correcting the first processing line to define a second processing line overlapping a periphery of the display panel, the correcting including reflecting the calculated offset, and processing the periphery of the display panel along the second processing line. The calculating of the offset includes obtaining a first offset defined as a displacement between points on the processing and panel marks, and obtaining a second offset defined as an angle of the panel mark with respect to the processing mark.

16 Claims, 15 Drawing Sheets

CD

MM

ST

METHOD OF FABRICATING DISPLAY DEVICE

CROSS-REFERENCE TO RELATED APPLICATION(S)

This application claims priority to and benefits of Korean Patent Application No. 10-2020-0070565 under 35 U.S.C. § 119, filed on Jun. 10, 2020 in the Korean Intellectual Property Office, the entire contents of which are incorporated herein by reference.

BACKGROUND

1. Technical Field

The invention relates to a method of fabricating a display device that includes cutting a display panel.

2. Description of the Related Art

Electronic products, such as smart phones, digital cameras, laptop computers, navigation systems, and smart televisions, include a display device for displaying an image. The display device generates an image and provides users with the image displayed on a display screen.

With the advancement of display technology, various types of display devices have recently been developed. A typical example of such display devices is a flexible display device that can be curvedly deformable, foldable, or rollable. The flexible display devices capable of being deformed in various shapes allow for improvement in portability and users' convenience.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Example embodiments of the invention provide a method of fabricating a display device, which method may be capable of precisely cutting a display device.

According to an embodiment of the disclosure, a method of fabricating a display device may include providing a substrate that includes a display panel, the display panel including a panel mark, placing a processing module on the display panel, the processing module including a processing mark and a first processing line adjacent to the processing mark, the processing mark corresponding to the panel mark of the display panel, calculating an offset in a plan view between the panel mark and the processing mark, correcting the first processing line to define a second processing line that overlaps a periphery of the display panel, the correcting including reflecting the calculated offset, and processing the periphery of the display panel along the second processing line. The calculating of the offset may include determining a position of a first point of the processing mark and a position of a second point of the panel mark, the second point corresponding to the first point, obtaining a first offset defined as a displacement between the positions of the first point and the second point, and obtaining a second offset defined as an angle of the panel mark with respect to the processing mark.

In an embodiment, each of the panel mark and the processing mark may be provided in plural.

In an embodiment, the panel mark may include a first panel mark defined adjacent to a first edge point of the display panel, a second panel mark defined adjacent to a second edge point of the display panel, the second panel mark being spaced apart in a first direction from the first edge point, a third panel mark defined adjacent to a third edge point of the display panel, the third panel mark being spaced apart in a second direction from the second edge point, the second direction intersecting the first direction, and a fourth panel mark defined adjacent to a fourth edge point of the display panel, the fourth panel mark being spaced apart in the second direction from the first edge point, the fourth edge point and the third edge point facing each other in the first direction.

In an embodiment, the obtaining of the first offset may include acquiring a displacement along an X-axis of the second point from the first point, and acquiring a displacement along a Y-axis of the second point from the first point, the Y-axis intersecting the X-axis.

In an embodiment, the processing mark may include a first horizontal part that extends in a first direction. The panel mark may include a second horizontal part that extends in the first direction. The obtaining of the second offset may include measuring an angle of the second horizontal part with respect to the first horizontal part.

In an embodiment, the display panel may include a cell substrate having a display region and a non-display region adjacent to the display region, a circuit element layer on the cell substrate, the circuit element layer overlapping the display region and the non-display region, a display element layer on the circuit element layer, the display element layer overlapping the display region, and at least one dam on the circuit element layer, the at least one dam overlapping the non-display region. The second processing line may be more widely spaced apart than the at least one dam from the display region in a plan view.

In an embodiment, the substrate may include a plurality of display panels that may be disposed in a first direction and a second direction that intersects the first direction.

In an embodiment, the processing module may irradiate a laser along the second processing line to separate the display panel from the substrate.

In an embodiment, an area within the first processing line may be different from an area within the second processing line in a plan view.

In an embodiment, the method may further comprise performing an annealing process on the substrate before the providing of the substrate.

In an embodiment, the display panel may include a flexible substrate.

According to an embodiment of the disclosure, a method of fabricating a display device may include placing a display panel on a first processing region including a first axis and a second axis that intersects the first axis, the display panel including a panel mark, calculating a displacement in a plan view along the first axis of the panel mark with respect to a processing mark defined in the first processing region, and a displacement in a plan view along the second axis of the panel mark with respect to the processing mark, calculating an angle in a plan view between the panel mark and the processing mark, correcting the first processing region into a second processing region, the correcting including reflecting the displacement along the first axis, the displacement along the second axis, and the angle, and processing a periphery of the display panel along a boundary of the second processing region.

In an embodiment, each of the panel mark and the processing mark may be provided in plural.

In an embodiment, the plural panel marks may be defined adjacent to a plurality of edge points of the display panel. The plural processing marks may be defined adjacent to a plurality of edge points of the first processing region.

In an embodiment, the panel mark may include a horizontal part parallel to the first axis.

In an embodiment, the display panel may include a cell substrate having a display region and a non-display region adjacent to the display region, and at least one dam on the non-display region. The boundary of the second processing region may be more widely spaced apart than the at least one dam from the display region in a plan view.

DETAILED DESCRIPTION OF THE EMBODIMENTS

Figure 1:
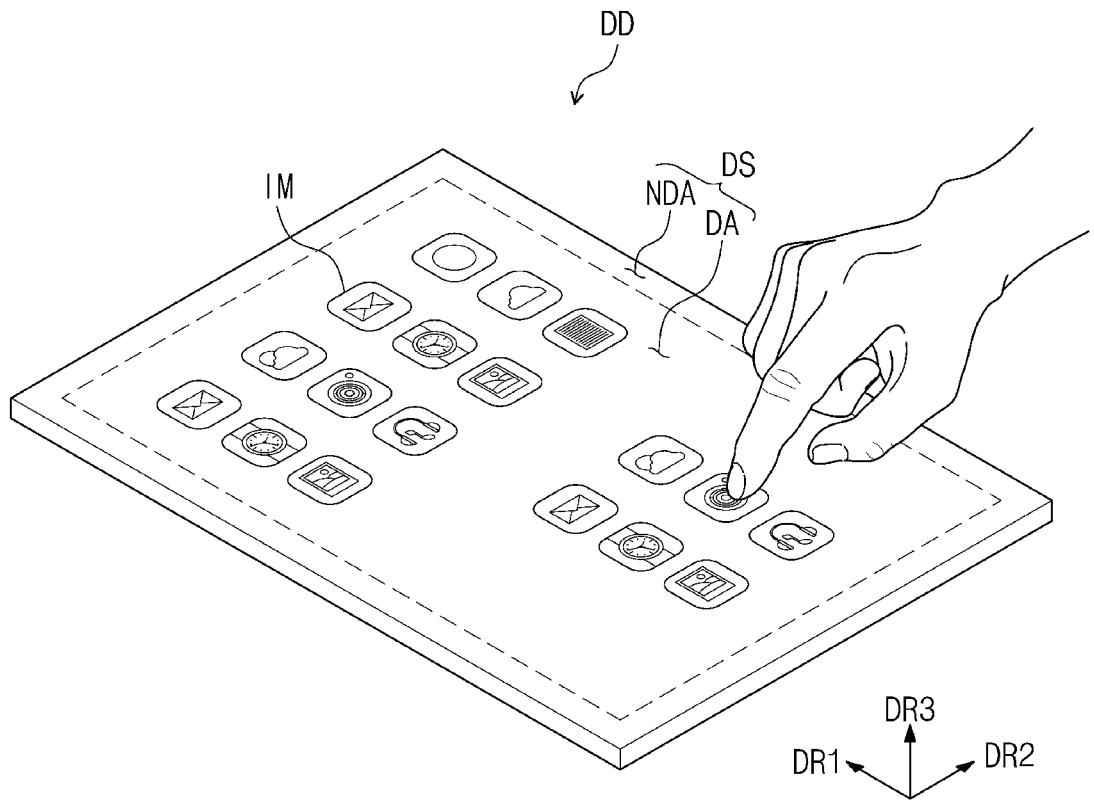
FIG. 1 illustrates a schematic perspective view showing a display device according to an embodiment of the disclosure.

In this description, when a certain component (or region, layer, portion, etc.) is referred to as being "on", "connected to", or "coupled to" other component(s), the certain component may be directly disposed on, directly connected to, or directly coupled to the other component(s) or at least one intervening component may be present therebetween.

Like numerals indicate like components. Moreover, in the drawings, thicknesses, ratios, and dimensions of components may be exaggerated for effectively explaining the technical contents.

The term "and/or" includes one or more combinations defined by associated components. For example, "A and/or B" may be understood to mean "A, B, or A and B." The terms "and" and "or" may be used in the conjunctive or disjunctive sense and may be understood to be equivalent to "and/or."

It will be understood that, although the terms first, second, etc. may be used herein to describe various components, these components should not be limited by these terms. These terms are only used to distinguish one component from another component. For example, a first component could be termed a second component, and vice versa without departing from the scope of the disclosure. Unless the context clearly indicates otherwise, the singular forms are intended to include the plural forms as well.

The terms "beneath", "lower", "above", "upper", and the like are used herein to describe one component's relationship to other component(s) illustrated in the drawings. The relative terms are intended to encompass different orientations in addition to the orientation depicted in the drawings.

Unless otherwise defined or implied, all terms used herein including technical and scientific terms have the same meaning generally understood by one of ordinary skill in the art. Also, terms as defined in dictionaries generally used should be understood as having meanings consistent with their meaning in the context of the relevant art and should not be understood as having an ideally or excessively formal meaning unless clearly defined herein.

It should be understood that the terms "comprise", "include", "have", and the like are used to specify the presence of stated features, integers, steps, operations, components, elements, or combinations thereof, but do not preclude the presence or addition of one or more other features, integers, steps, operations, components, elements, or combinations thereof.

The term overlap may include layer, stack, face or facing, extending over, covering or partly covering or any other suitable term as would be appreciated and understood by those of ordinary skill in the art.

"About" or "approximately" or "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

The following will now describe in detail embodiments of the disclosure with reference to the accompanying drawings.

Figure 2:
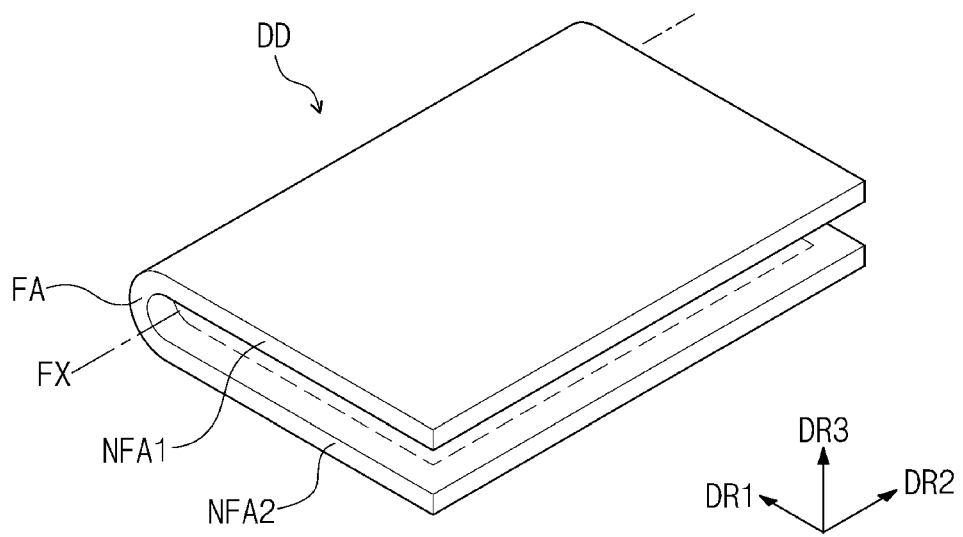
FIG. 2 illustrates a schematic perspective view showing a folded state of the display device depicted in FIG. 1.
Figure 3A:
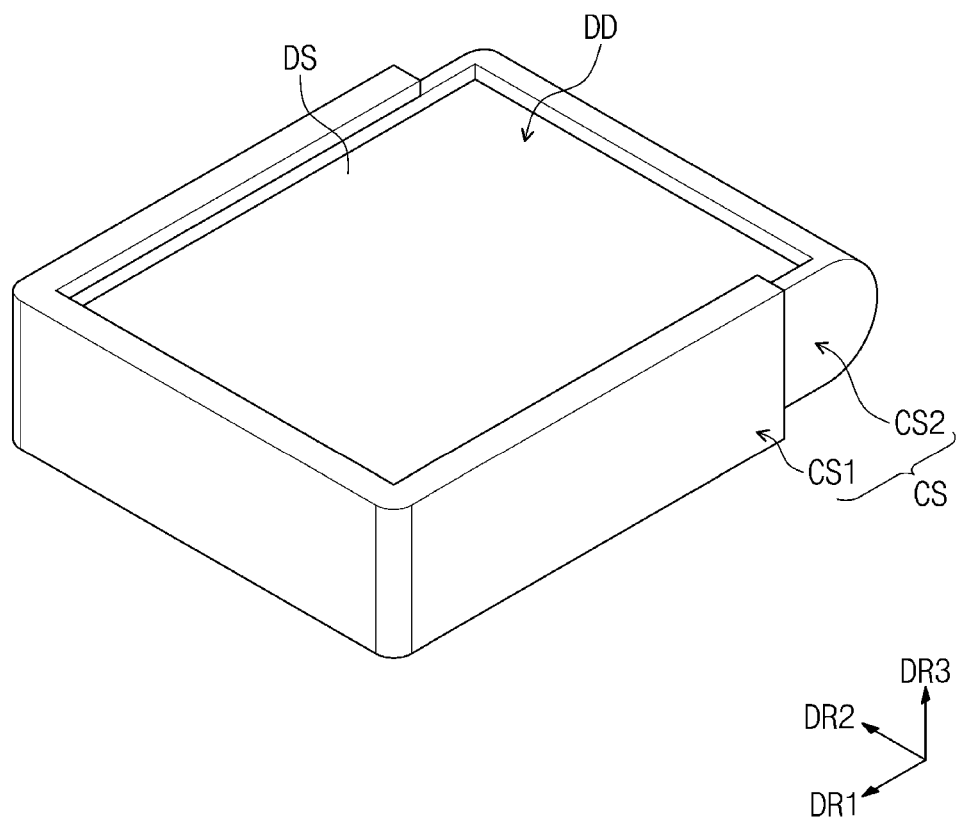
FIGS. 3A and 3B illustrate schematic perspective views showing rolled and unrolled states of the display device depicted in FIG. 1.
Figure 3B:
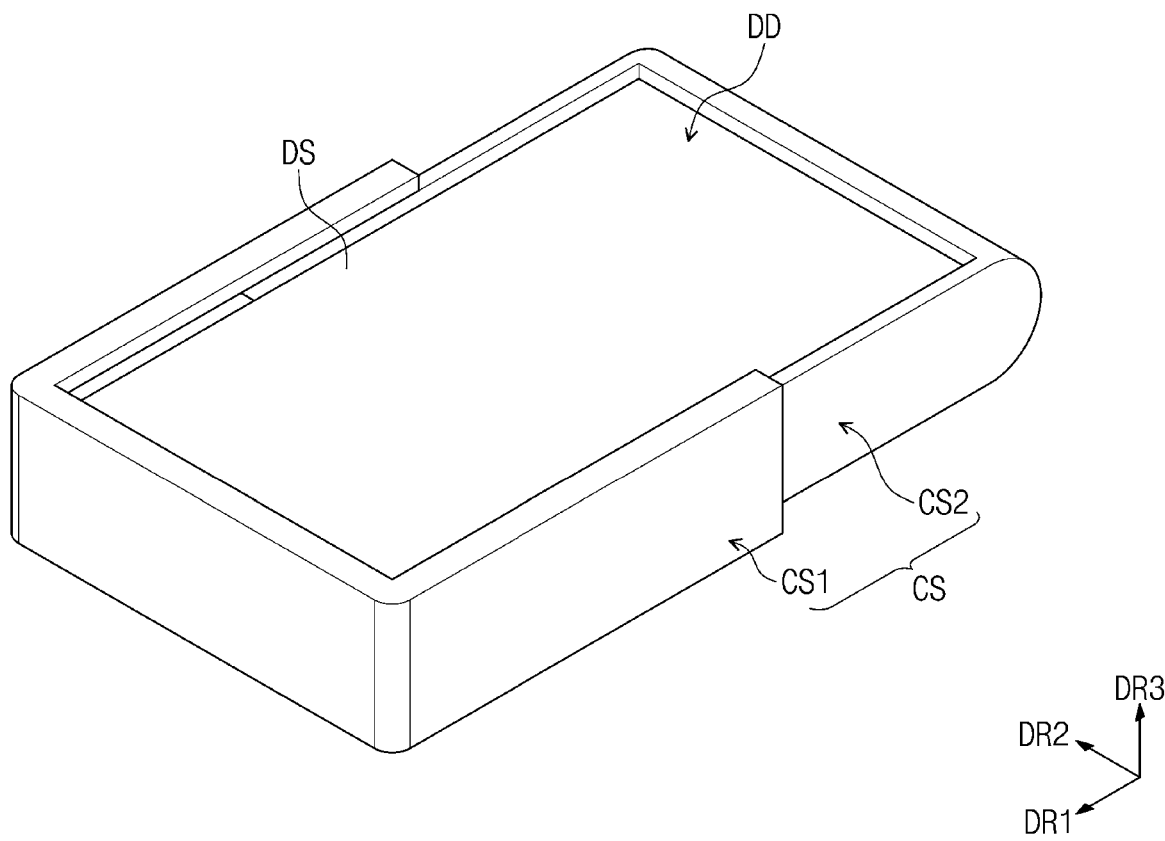

FIG. 1 illustrates a schematic perspective view showing a display device according to an embodiment of the disclosure. FIG. 2 illustrates a schematic perspective view showing a folded state of the display device depicted in FIG. 1. FIGS. 3A and 3B illustrate schematic perspective views showing rolled and unrolled states of the display device depicted in FIG. 1.

Referring to FIG. 1, a display device DD according to an embodiment of the disclosure may have a rectangular shape with long sides that extend in a first direction DR1 and short sides that extend in a second direction DR2 intersecting the first direction DR1. The disclosure, however, is not limited thereto, and the display device DD may have a circular shape, a polygonal shape, or any other suitable shape.

The display device DD may have a small thickness in a third direction DR3. The third direction DR3 may indicate a direction that substantially perpendicularly intersects a plane defined by the first direction DR1 and the second direction DR2. In this description, the phrase "in case viewed in a plan view" may mean "in case viewed in the third direction DR3."

The display device DD may have a top surface, which top surface may be defined as a display surface DS and may have a plane defined by the first and second directions DR1 and DR2. The display surface DS may provide users with images IM generated from the display device DD.

The display surface DS may include a display region DA and a non-display region NDA that may be adjacent to (e.g., may surround) the display region DA. The display region DA may display the images IM, and the non-display region NDA may not display the images IM. The non-display region NDA may provide the display device DD with a periphery that may surround the display region DA and may be printed with a certain color.

According to an embodiment of the disclosure, the display device DD may be a flexible display device. For example, the display device DD may be folded or rolled.

Referring to FIG. 2, the display device DD may fold inwards, or in-fold, to avoid external exposure of the display surface DS. For example, the display device DD may include a first non-folding region NFA1, a second non-folding region NFA2, and a folding region FA disposed between the first non-folding region NFA1 and the second non-folding region NFA2. The first non-folding region NFA1, the second non-folding region NFA2, and the folding region FA may be arranged in the first direction DR1.

The display device DD may be foldable about a folding axis FX parallel to the second direction DR2. In case that the display device DD may be folded, the first and second non-folding regions NFA1 and NFA2 may allow their top surfaces to face each other. Therefore, the display device DD may not permit the external exposure of the display surface DS.

However, the folding mode of the display device DD is not limited to that discussed above. For example, the display device DD may fold outwards, or out-fold, to externally expose the display surface DS.

Referring to FIGS. 3A and 3B, the display device DD may perform rolling and unrolling operations. For example, the display device DD may be mounted in a casing CS. A portion of the display device DD may be housed in a wound state in the casing CS.

For example, the casing CS may include a first casing CS1 and a second casing CS2 that may be extended to each other to accommodate the display device DD. The second casing CS2 may be associated with the first casing CS1 so as to move in the first direction DR1. For example, the second casing CS2 may move away from or close to the first casing CS1. As the second casing CS2 moves in the first direction DR1, the display surface DS may have a variable area at an externally exposed portion thereof.

As discussed above, the display device DD may be folded or rolled to provide users with the display surface DS whose size may be variable.

Figure 4:
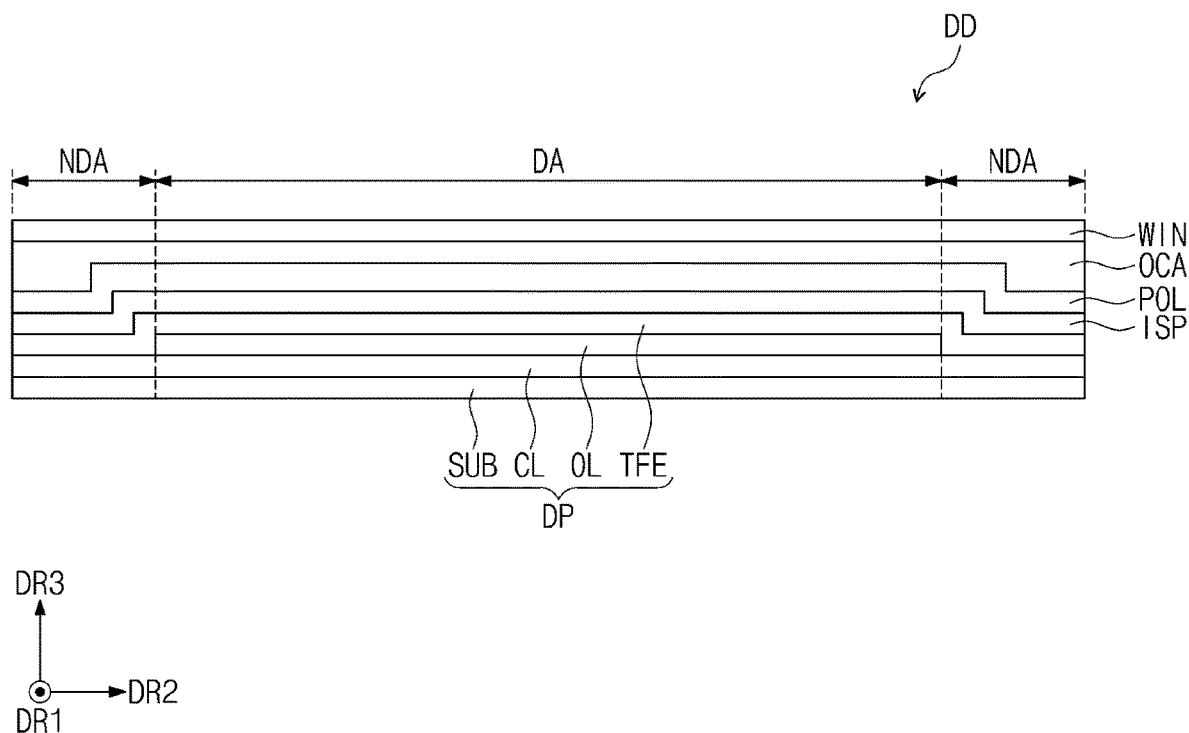
FIG. 4 illustrates a schematic cross-sectional view showing an example of the display device depicted in FIG. 1.

FIG. 4 illustrates a schematic cross-sectional view showing an example of the display device depicted in FIG. 1.

Referring to FIG. 4, the display device DD may include a display panel DP, an input sensing part ISP, an antireflection layer POL, and a window WIN.

A light emitting display panel may be adopted as the display panel DP according to an embodiment of the disclosure. For example, the display panel DP may be an organic light emitting display panel or a quantum-dot light emitting display panel. An emission layer of the organic light emitting display panel may include an organic light emitting material. An emission layer of the quantum-dot light emitting display panel may include a quantum-dot or a quantum-rod. The following will describe an example in which the display panel DP may be an organic light emitting display panel.

The display panel DP may use an organic light emitting material to generate an image. The image generated from the display panel DP may be visible to users through the display surface DS depicted in FIG. 1. The display panel DP may include a cell substrate SUB, a circuit element layer CL, a display element layer OL, and a thin-film encapsulation layer TFE.

The cell substrate SUB may be a base layer of the display panel DP. The cell substrate SUB may include a flexible substrate. For example, the cell substrate SUB may include polyimide (PI), polyethyleneterephthalate (PET), or a combination thereof. However, the material of the cell substrate SUB is not limited to that discussed above. The cell substrate SUB may include any suitable material having flexibility.

The circuit element layer CL may be disposed on the cell substrate SUB. The circuit element layer CL may overlap the display region DA and the non-display region NDA.

The circuit element layer CL may include a dielectric layer, a semiconductor pattern, a conductive pattern, and a signal line. Coating and deposition processes may be employed to form a dielectric layer, a semiconductor layer, and a conductive layer on the cell substrate SUB, and a photolithography process may be performed several times to selectively pattern the dielectric layer, the semiconductor layer, and the conductive layer. Afterwards, there may be formed the semiconductor pattern, the conductive pattern, and the signal line of the circuit element layer CL.

The display element layer OL may be disposed on the circuit element layer CL. The display element layer OL may overlap the display region DA. The display element layer OL may include a light emitting element. For example, the display element layer OL may include an organic light emitting material, a quantum dot, a quantum rod, or a micro-led.

The thin-film encapsulation layer TFE may be disposed on the display element layer OL. For example, a central portion of the thin-film encapsulation layer TFE may be disposed on the display element layer OL, and an edge portion of the thin-film encapsulation layer TFE may be disposed on the circuit element layer CL.

The thin-film encapsulation layer TFE may include at least two inorganic layers and an organic layer disposed between the inorganic layers. The inorganic layers may include an inorganic material and may protect the display element layer OL against moisture and/or oxygen. The organic layer may include an organic material and may protect the display element layer OL against foreign substances such as dust particles.

The input sensing part ISP may be disposed on the display panel DP. The input sensing part ISP may detect an external input (e.g., user's touch), and may convert the external input into an input signal and provide the display panel DP with the input signal. The display panel DP may receive the input signal from the input sensing part ISP and generate an image that corresponds to the input signal.

The antireflection layer POL may be disposed on the display panel DP. The antireflection layer POL may be an antireflection film that extinguishes external light. The antireflection layer POL may reduce a reflectance of external light that may be incident toward the display panel DD from outside the display device DD. For example, the antireflection layer POL may include one or more of a retarder and a polarizer.

The window WIN may be disposed on the antireflection layer POL. The window WIN may protect the display panel DP and the input sensing part ISP against external scratches and impact. The window WIN may be attached through an adhesive OCA to the antireflection layer POL. The adhesive OCA may include an optically clear adhesive. An image generated from the display panel DP may pass through the window WIN and may be provided to users.

However, the cross-sectional structure of the display device DD is not limited to that discussed above. The display device DD may include various functional layers.

The following will explain a method of fabricating the display device DD shown in FIG. 1. For example, the following method relates to one selected from various processes for fabricating the display device DD, which select process cuts multiple display panels DP from a substrate MS on which the multiple display panels DP may be partitioned from each other.

Figure 5:
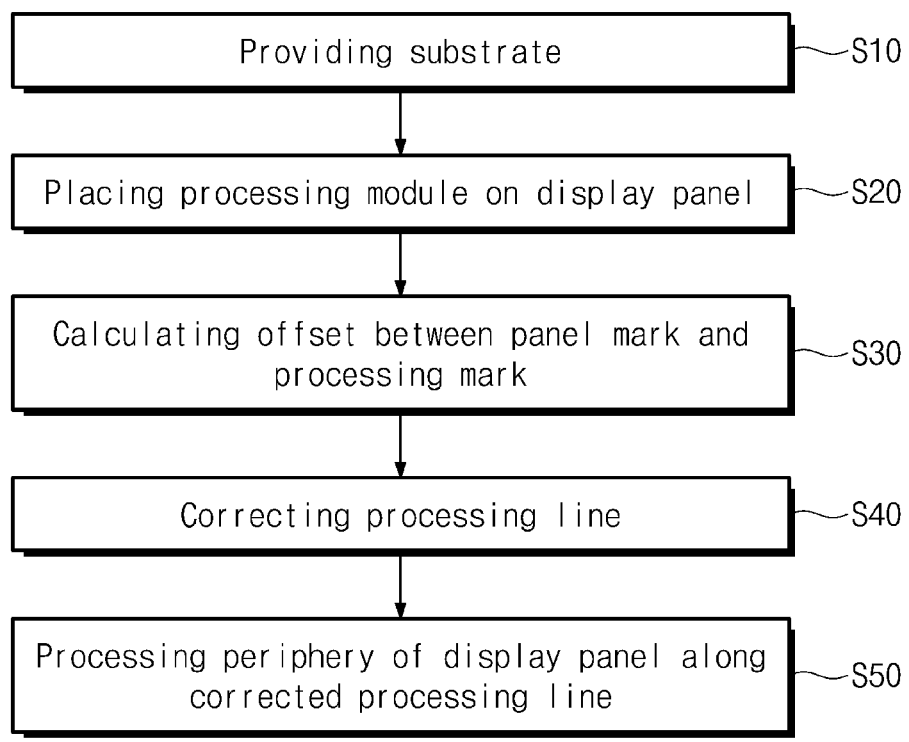
FIG. 5 illustrates a flow chart showing a method of fabricating a display device according to an embodiment of the disclosure.
Figure 6:
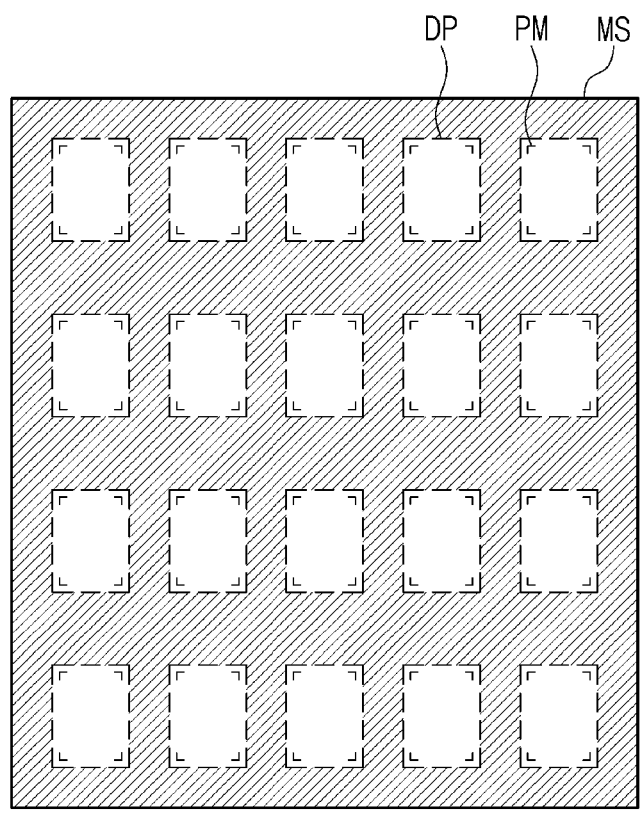
FIG. 6 illustrates a schematic diagram showing an example of a substrate on which multiple display panels may be partitioned from each other.
Figure 6:
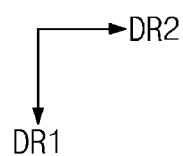

FIG. 5 illustrates a flow chart showing a method of fabricating a display device according to an embodiment of the disclosure. FIG. 6 illustrates a schematic diagram showing an example of a substrate on which multiple display panels may be partitioned from each other.

Referring to FIGS. 5 and 6, at a step S10, a substrate MS may be provided. In case viewed in a plan view, the substrate MS may have a tetragonal shape. Multiple display panels DP may be partitioned on the substrate MS. For example, each of the display panels DP may have long sides that extend in the first direction DR1 and short sides that extend in the second direction DR2. The display panels DP may be arranged in the first direction DR1 and the second direction DR2. The display panels DP may be spaced apart from each other in the first direction DR1 and the second direction DR2.

FIG. 6 depicts twenty display panels DP may be partitioned on the substrate MS, but this is merely an example. Substantially more than twenty display panels DP may be partitioned on the substrate MS.

The substrate MS and the display panel DP may have a same cross-sectional structure. For example, the substrate MS may include a cell substrate SUB, a circuit element layer CL, a display element layer OL, and a thin-film encapsulation layer TFE (see FIG. 4).

A panel mark PM may be defined on each of the display panels DP. In an embodiment, multiple panel marks PM may be provided on each of the display panels DP. For example, each of the multiple panel marks PM may be defined on an edge portion of the display panel DP. The panel marks PM may be used in a procedure where the display panel DP may be aligned with a cutting tool CD which will be discussed below.

Figure 7:
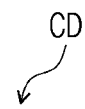
FIG. 7 illustrates a schematic diagram showing an example of a cutting tool used for fabricating a display device according to an embodiment of the disclosure.
Figure 7:
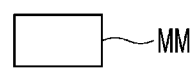
Figure 7:
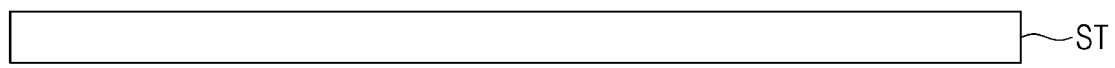
Figure 7:
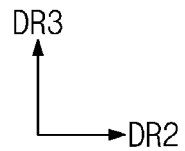

FIG. 7 illustrates a schematic diagram showing an example of a cutting tool used for fabricating a display device according to an embodiment of the disclosure.

Referring to FIG. 7, a cutting tool CD may include a stage ST and a processing module MM. The stage ST may support the substrate MS while the cutting tool CD performs a cutting process.

The processing module MM may be disposed close to the stage ST. For example, the stage ST may be spaced apart in the third direction DR3 from the processing module MM. The processing module MM may cut a target object disposed on the stage ST. For example, the processing module MM may provide a target object with a laser to cut the target object. For this, the processing module MM may include a laser generator that produces the laser, a scanner that determines a laser irradiation position, and a lens that diffuses and/or condenses the laser. However, the laser irradiation does not limit a method in which the processing module MM processes a target object.

Figure 8:
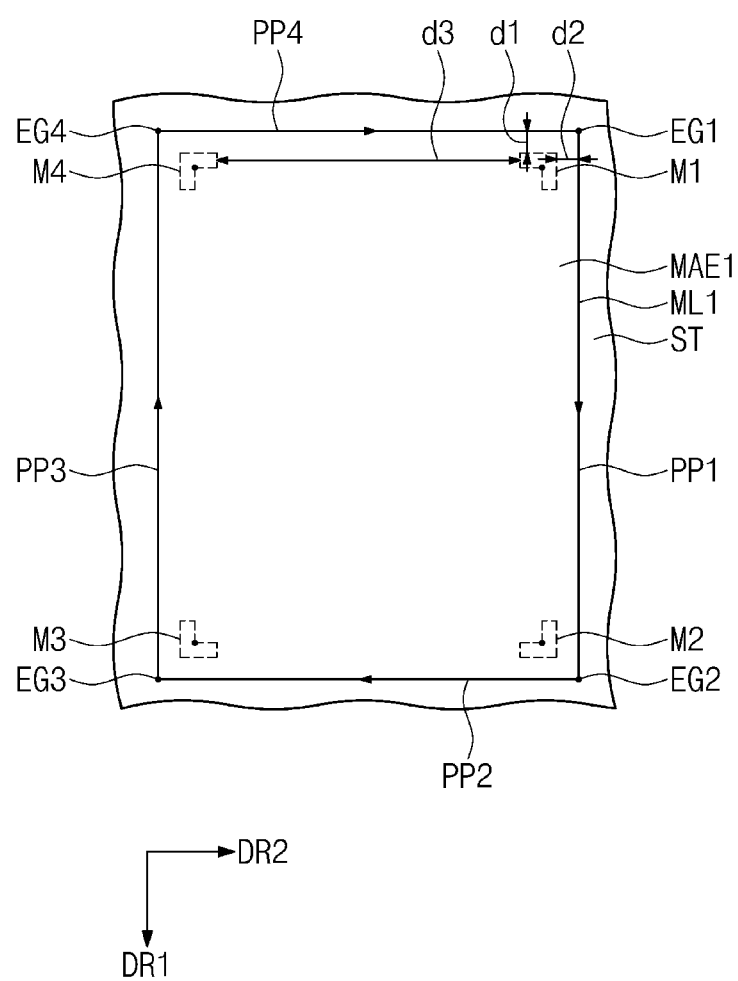
FIG. 8 illustrates a schematic plan view showing an example of a stage on which may be present a processing module of the cutting tool depicted in FIG. 7.

FIG. 8 illustrates a schematic plan view showing a stage on which may be present the processing module of the cutting tool depicted in FIG. 7.

Referring to FIG. 8, a first processing region MAE1 may be defined on the processing module MM. The first processing region MAE1 may be an imaginary zone. The processing module MM may process a target object disposed on the first processing region MAE1.

In case viewed in a plan view, the first processing region MAE1 may have a tetragonal shape. The shape of the first processing region MAE1 may be substantially similar to that of the display panel DP shown in FIG. 6. The first processing region MAE1 may be defined as an initial processing range of the processing module MM.

The first processing region MAE1 may include a first processing line ML1 and a processing mark M1, M2, M3, and M4. The processing marks M1 to M4 may be imaginary marks, which may be used to align the processing module MM with a target object (e.g., a display panel) disposed on the stage ST. The first processing line ML1 may be an imaginary line along which the processing module MM irradiates a laser.

In an embodiment, the processing mark M1 to M4 may be provided in plural. For example, a first processing mark M1, a second processing mark M2, a third processing mark M3, and a fourth processing mark M4 may be defined on the first processing region MAE1.

Each of the first to fourth processing marks M1 to M4 may be defined on an edge portion of the first processing region MAE1. For example, the first processing mark M1 may be defined around a first edge point EG1 of the first processing region MAE1. Based on FIG. 8, the first edge point EG1 may indicate a vertex positioned at a right top of the first processing region MAE1. The first processing mark M1 may have a horizontally flipped F shape.

The second processing mark M2 may be defined around a second edge point EG2 of the first processing region MAE1. Based on FIG. 8, the second edge point EG2 may indicate a vertex positioned at a right bottom of the first processing region MAE1. The second processing mark M2 may have a horizontally flipped L shape, or a shape obtained in case that the shape of the first processing mark M1 may be rotated at 90° in the clockwise direction.

The third processing mark M3 may be defined around a third edge point EG3 of the first processing region MAE1. Based on FIG. 8, the third edge point EG3 may indicate a vertex positioned at a left bottom of the first processing region MAE1. The third processing mark M3 may have an L shape, or shape obtained in case that the shape of the first processing mark M1 may be rotated at 180° in the clockwise direction.

The fourth processing mark M4 may be defined around a fourth edge point EG4 of the first processing region MAE1. Based on FIG. 8, the fourth edge point EG4 may indicate a vertex positioned at a left top of the first processing region MAE1. The fourth processing mark M4 may have a vertically flipped L shape, or a shape obtained in case that the shape of the first processing mark M1 may be rotated at 90° in the counterclockwise direction.

However, the shapes of the first to fourth processing marks M1 to M4 are not limited to those discussed above. The first to fourth processing marks M1 to M4 may have various shapes. The first to fourth processing marks M1 to M4 may be positioned at various locations. For example, the first processing region MAE1 may also have one or more processing marks defined on a central portion thereof.

The first processing line ML1 may be defined outside the first to fourth processing marks M1 to M4. The first processing line ML1 may be defined by line segments that connect the first, second, third, and fourth edge points EG1, EG2, EG3, and EG4 to each other. The first processing line ML1 may include, for example, a first part PP1, a second part PP2, a third part PP3, and a fourth part PP4. For example, the first part PP1 may be a line segment that connects the first edge point EG1 to the second edge point EG2. The second part PP2 may be a line segment that connects the second edge point EG2 to the third edge point EG3. The third part PP3 may be a line segment that connects the third edge point EG3 to the fourth edge point EG4. The fourth part PP4 may be a line segment that connects the fourth edge point EG4 to the first edge point EG1.

The first processing line ML1 may define a laser irradiation direction. For example, as shown in FIG. 8, the first processing line ML1 may define a clockwise direction of laser irradiation. The invention, however, is not limited thereto, and a counterclockwise direction may be defined as the laser irradiation direction.

A distance between one of the first to fourth processing marks M1 to M4 and the first processing line ML1 may be less than a distance between neighboring ones of the first to fourth processing marks M1 to M4.

For example, in the first direction DR1, a first distance d1 may indicate a distance between the first processing mark M1 and the fourth part PP4 of the first processing line ML1. In the second direction DR2, a second distance d2 may indicate a distance between the first processing mark M1 and the first part PP1 of the first processing line ML1.

In the second direction DR2, a third distance d3 may indicate a distance between the first processing mark M1 and the fourth processing mark M4. The first distance d1 and the second distance d2 may be small enough so as to be negligible compared to the third distance d3. For example, in case that the third distance d3 may be about several tens of millimeters (mm), the first distance d1 and the second distance d2 may each be about several micrometers (μm).

Figure 9:
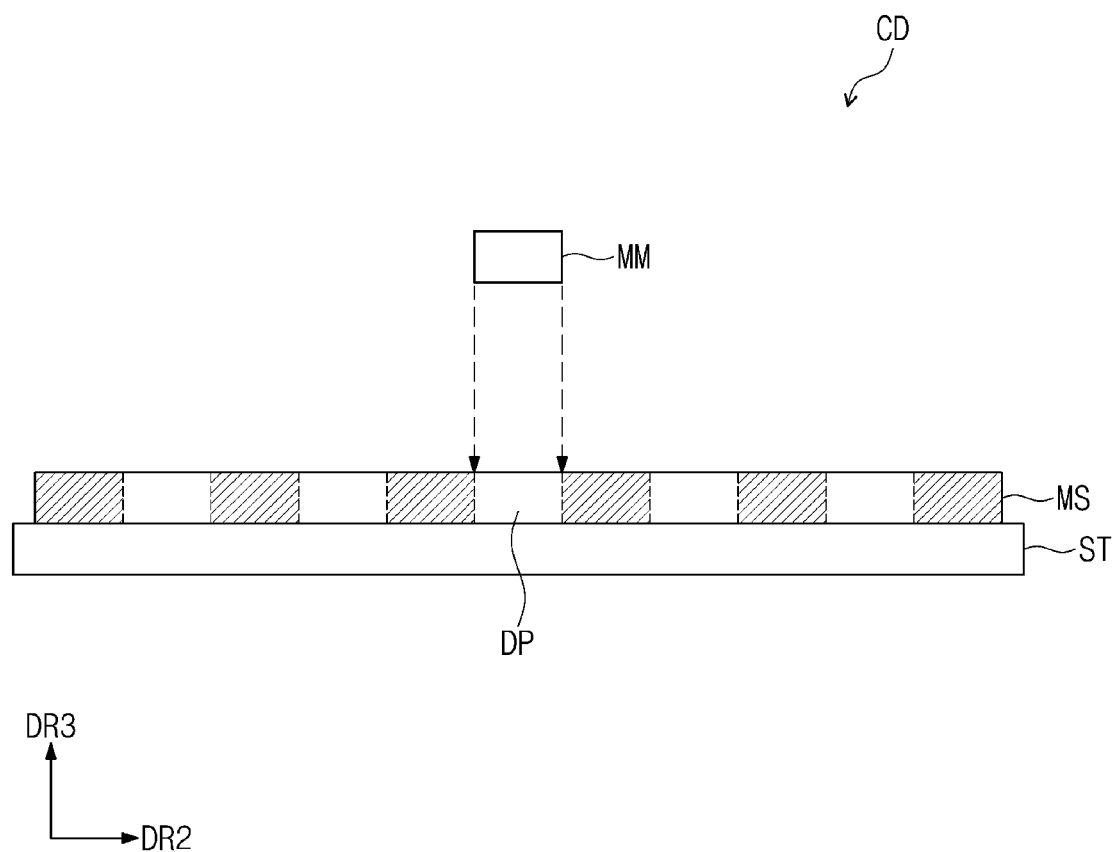
FIG. 9 illustrates a schematic diagram showing an example of the substrate illustrated in FIG. 6 disposed on the stage of the cutting tool depicted in FIG. 7.

FIG. 9 illustrates a schematic diagram showing an example of the substrate illustrated in FIG. 6 disposed on the stage of the cutting tool depicted in FIG. 7.

Referring to FIGS. 6 and 9, at a step S20, the processing module MINI may be placed on the display panel DP. For example, the substrate MS may be disposed on the stage ST. The processing module MM may be placed on one of the display panels DP partitioned on the substrate MS. The processing module MINI may process the display panel DP on the substrate MS.

Figure 10:
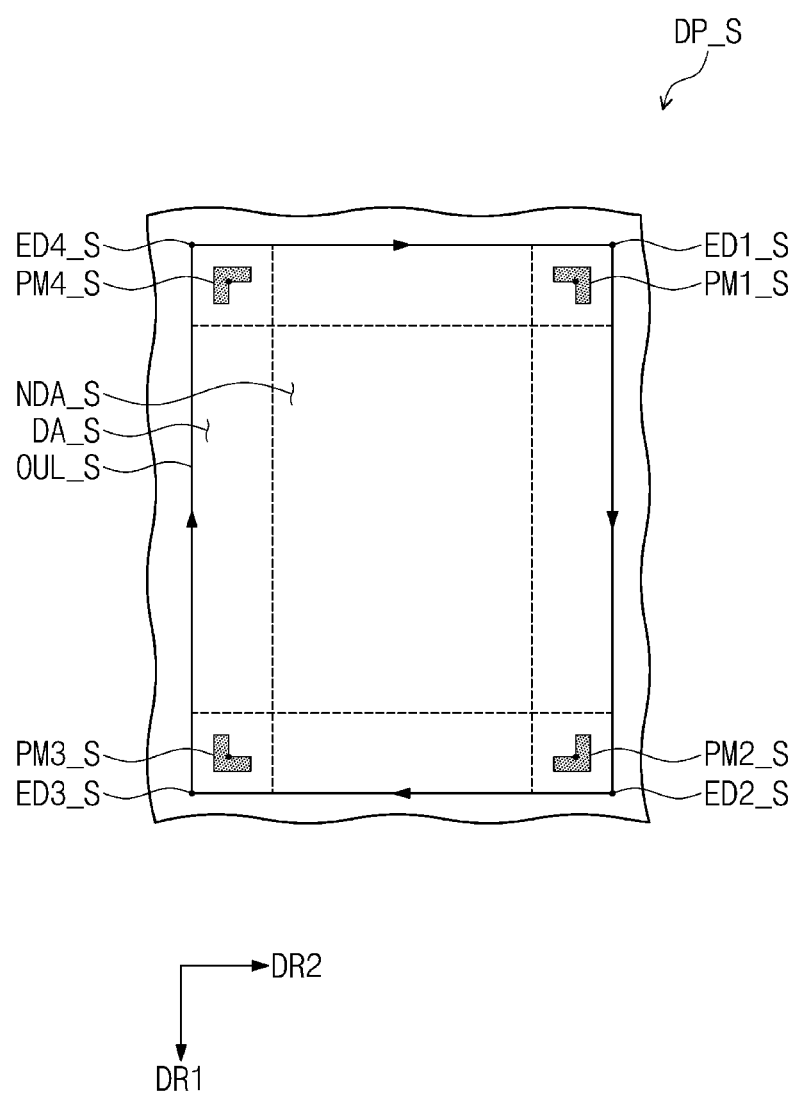
FIGS. 10 and 11 illustrate schematic plan views showing deformation of a display panel due to thermal expansion.
Figure 11:
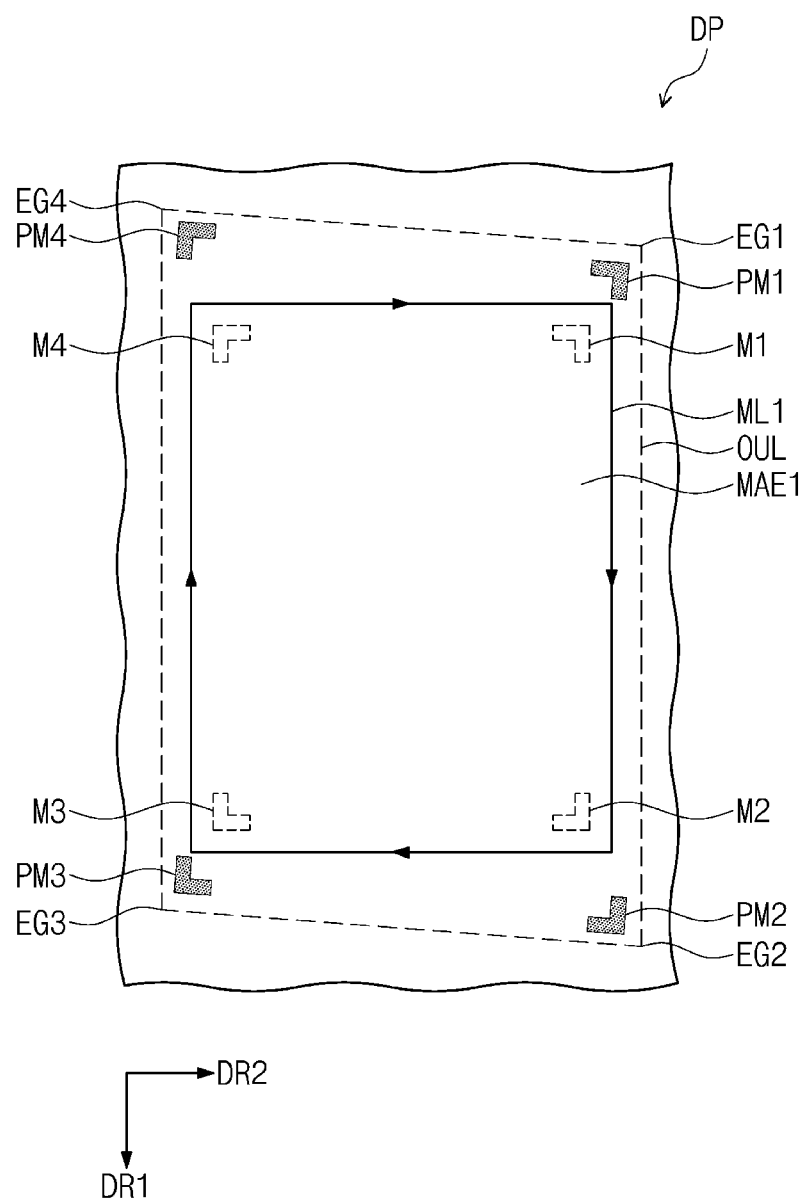

FIGS. 10 and 11 illustrate schematic plan views showing deformation of a display panel due to thermal expansion. In the following, FIG. 10 depicts by way of example a display panel DP_S according to a comparative example, and the display panel DP_S may be defined to indicate a display panel that has not yet undergone an annealing process. For example, the display panel DP_S shown in FIG. 10 may have a shape of a display panel without being deformed due to thermal expansion.

FIG. 11 shows a display panel according to an embodiment of the disclosure, and the display panel DP in an embodiment may be defined to indicate a display panel that has experienced an annealing process. For example, the display panel DP shown in FIG. 11 may have a shape of a display panel that has been deformed due to thermal expansion. For convenience of description, FIG. 11 shows the display panel DP overlapped with the first processing region MAE1 of the processing module MINI illustrated in FIG. 9.

Referring to FIGS. 8 and 10, the display panel DP_S according to a comparative example may include a display region DA_S and a non-display region NDA_S. First to fourth edge points ED1_S to ED4_S may denote four vertices of the display panel DP_S.

A first panel mark PM1_S may be defined adjacent to (e.g., around) the first edge point ED1_S, a second panel mark PM2_S may be defined adjacent to (e.g., around) the second edge point ED2_S, a third panel mark PM3_S may be defined adjacent to (e.g., around) the third edge point ED3_S, and a fourth panel mark PM4_S may be defined adjacent to (e.g., around) the fourth edge point ED4_S. The first to fourth panel marks PM1_S to PM4_S may be defined on the non-display region NDA_S.

The first to fourth panel marks PM1_S to PM4_S may correspond to the first to fourth processing marks M1 to M4 shown in FIG. 8.

In a plan view, in case that the first to fourth panel marks PM1_S to PM4_S may be exactly aligned respectively with the first to fourth processing marks M1 to M4, the first processing line ML1 may overlap an outline OUL_S of the display panel DP_S. The outline OUL_S may define a periphery of the display panel DP_S. In case that the processing module MM irradiates a laser along the first processing line ML1, the processing module MM may cut the display panel DP_S along the first processing line ML1.

However, in practice, an actual display panel (e.g., a practical display panel) may have a shape different from that of the display panel DP_S. For example, before the step S10 may be performed, an annealing process may be performed on the substrate MS. During the annealing process, the substrate MS may experience a local thermal expansion. For example, the display panels DP partitioned on the substrate MS may have different shapes from each other.

Therefore, to exactly separate the display panel DP from the substrate MS without damage to the display panel DP, it may be required to perform a cutting process in consideration of each shape of the display panels DP deformed due to thermal expansion.

Referring to FIG. 11, the display panel DP may experience different degrees of deformation at various positions thereof. For example, the display panel DP may have different degrees of deformation at positions around the first to fourth edge points EG1 to EG4.

Therefore, a misalignment may be presented between the first to fourth processing marks M1 to M4 and the first to fourth panel marks PM1 to PM4 of the display panel DP, and a misalignment may also be present between the first processing line ML1 and an outline OUL of the display panel DP.

In case that the processing module MM cuts the display panel DP along the first processing line ML1 as shown in FIG. 11, the display panel DP may suffer from defects (e.g., cracks).

As an approach to solve the problem mentioned above, a method of fabricating a display device according to an embodiment of the disclosure suggests a way of defining a noble processing region in consideration of deformation of the display panel DP.

FIGS. 12A to 12D illustrate schematic diagrams showing a method of calculating an offset between the processing mark and the panel mark depicted in FIG. 11. In FIGS. 12A to 12D, a horizontal axis may be defined as an X-axis, and a vertical axis may be defined as a Y-axis. The X-axis and the Y-axis may be respectively substantially parallel to the second direction DR2 and the first direction DR1. In FIGS. 12A to 12D, each point may be represented by a coordinate system (X, Y, Z). The symbol Z may mean a degree of inclination with respect to the X-axis.

Referring to FIGS. 6 and 12A to 12D, at a step S30, an offset may be calculated between the panel mark PM1 to PM4 and the processing mark M1 to M4.

In an embodiment, the offset calculation step S30 may include a step of calculating a first offset between the processing mark M1 to M4 and the panel mark PM1 to PM4, and a step of calculating a second offset between the processing mark M1 to M4 and the panel mark PM1 to PM4.

The first offset may indicate a displacement between a first point M1_C to M4_C defined on the processing mark M1 to M4 and a second point PM1_C to PM4_C defined on the panel mark PM1 to PM4.

At the step of calculating the first offset, the displacement between the first point M1_C to M4_C and its corresponding second point PM1_C to PM4_C may be defined by determining a position of the first point M1_C to M4_C on the processing mark M1 to M4 and of the second point PM1_C to PM4_C on the panel mark PM1 to PM4.

The second offset may indicate a degree of inclination of the panel mark PM1 to PM4 with respect to the processing mark M1 to M4. At the step of calculating the second offset, an angle may be calculated between the processing mark M1 to M4 and the panel mark PM1 to PM4.

Figure 12A:
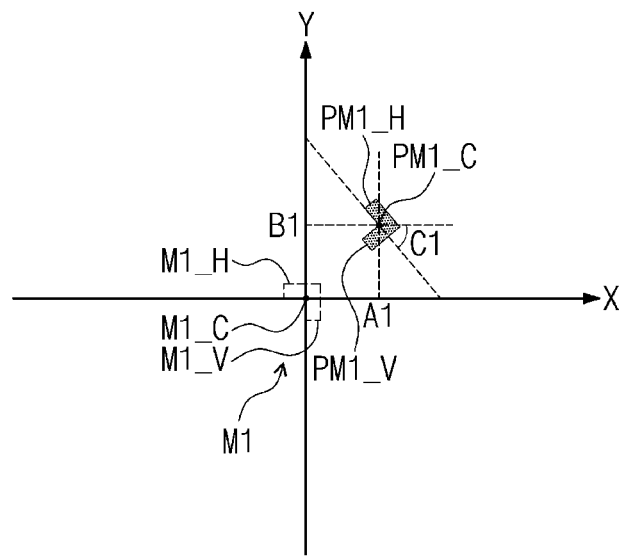
FIGS. 12A to 12D illustrate schematic diagrams showing a method of calculating an offset between a processing mark and a panel mark depicted in FIG. 11.

Referring to FIG. 12A, the first processing mark M1 may include a first horizontal part M1_H and a first vertical part M1_V. The first horizontal part M1_H may extend parallel to a direction of the X-axis. The first vertical part M1_V may extend from the first horizontal part M1_H and may be parallel to a direction of the Y-axis. Likewise the first processing mark M1, each of the second to fourth processing marks M2 to M4 shown in FIGS. 12B to 12D may include a first horizontal part and a first vertical part.

The first point M1_C may be defined to indicate a center of the first processing mark M1. The first horizontal part M1_H and the first vertical part M1_V may meet each other at the first point M1_C.

The first panel mark PM1 of the display panel DP may correspond to the first processing mark M1. The first panel mark PM1 may include a second horizontal part PM1_H and a second vertical part PM1_V. Likewise the first panel mark PM1, each of the second to fourth panel marks PM2 to PM4 shown in FIGS. 12B to 12D may include a second horizontal part and a second vertical part. The second point PM1_C may correspond to the first point M1_C of the first processing mark M1.

As shown in FIG. 12A, in case that a coordinate (0, 0, 0) may be assigned to the first point M1_C of the first processing mark M1, a coordinate (A1, B1, C1) may be given to the second point PM1_C of the first panel mark PM1. For example, the second point PM1_C may be spaced apart from the first point M1_C at A1 along the X-axis and also at B1 along the Y-axis.

The first panel mark PM1 may be inclined at C1 with respect to the first processing mark M1. For example, the second horizontal part PM1_H of the first panel mark PM1 may be inclined at C1 with respect to the first horizontal part M1_H of the first processing mark M1.

Figure 12B:
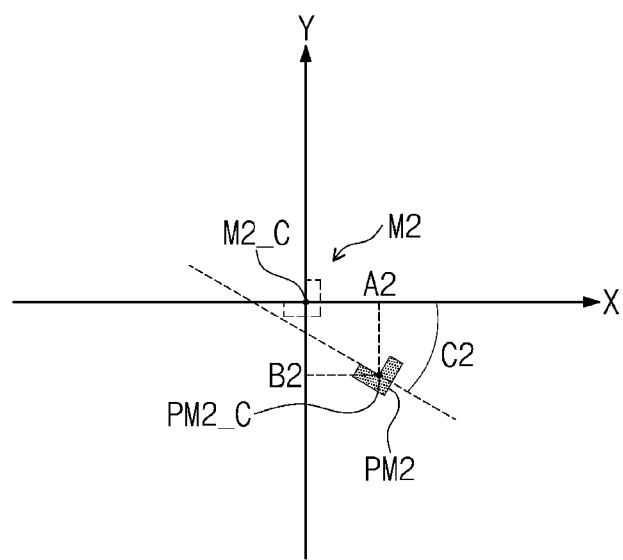

As shown in FIG. 12B, in case that a coordinate (0, 0, 0) may be assigned to the first point M2_C of the second processing mark M2, a coordinate (A2, B2, C2) may be given to the second point PM2_C of the second panel mark PM2. For example, the second point PM2_C may be spaced apart from the first point M2_C at A2 along the X-axis and also at B2 along the Y-axis. The second panel mark PM2 may be inclined at C2 with respect to the second processing mark M2.

Figure 12C:
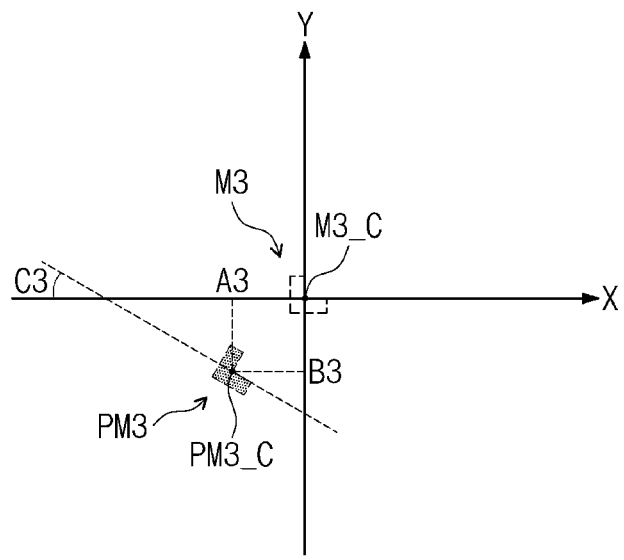
Figure 12D:
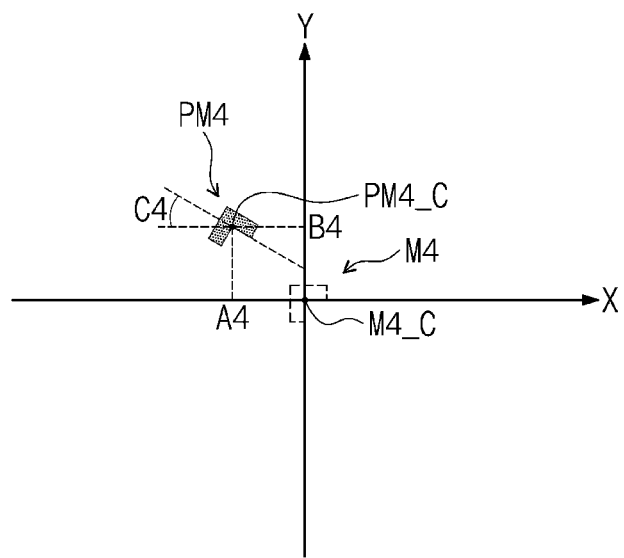

As shown in FIG. 12C, in case that a coordinate (0, 0, 0) may be assigned to the first point M3_C of the third processing mark M3, a coordinate (A3, B3, C3) may be given to the second point PM3_C of the third panel mark PM3. For example, the second point PM3_C may be spaced apart from the first point M3_C at A3 along the X-axis and also at B3 along the Y-axis. The third panel mark PM3 may be inclined at C3 with respect to the third processing mark M3.

As shown in FIG. 12C, in case that a coordinate (0, 0, 0) may be assigned to the first point M4_C of the fourth processing mark M4, a coordinate (A4, B4, C4) may be given to the second point PM4_C of the fourth panel mark PM4. For example, the second point PM4_C may be spaced apart from the first point M4_C at A4 along the X-axis and also at B4 along the Y-axis. The fourth panel mark PM4 may be inclined at C4 with respect to the fourth processing mark M4.

Figure 13:
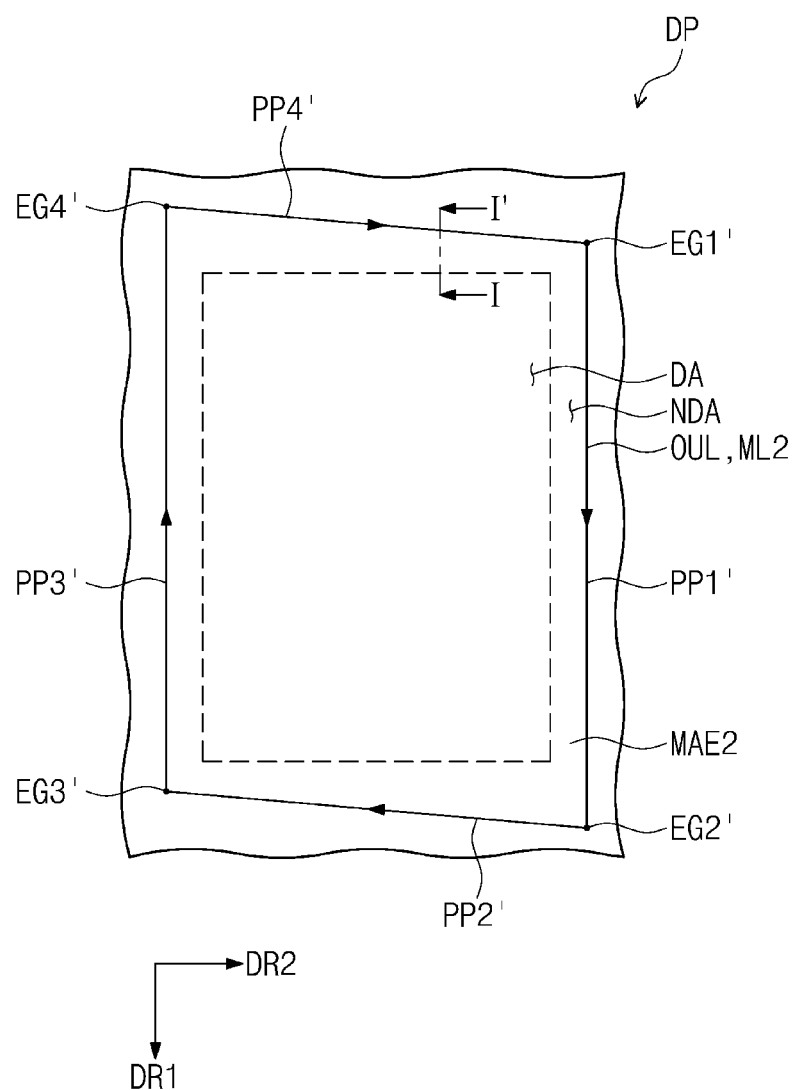
FIG. 13 illustrates a schematic plan view showing a second processing line obtained by reflecting a calculated offset to a first processing line depicted in FIG. 11.

FIG. 13 illustrates a schematic plan view showing a second processing line obtained by reflecting the calculated offset to the first processing line depicted in FIG. 11.

Referring to FIGS. 5, 12A to 12D, and 13, at a step S40, a processing line of the process module MM may be corrected. For example, a second processing region MAE2 may be newly defined on the processing module MM. The second processing region MAE2 may include a second processing line ML2.

The first offset calculated at the step S30 may be reflected to shift first to fourth edge points EG1' to EG4' of the second processing line ML2. Therefore, first to fourth parts PP1' to PP4' of the second processing line ML2 may also be corrected.

For example, the first part PP1' of the second processing line ML2 may be a value obtained in case that the first part PP1 of the first processing line ML1 may be multiplied by K1. K1 may satisfy the following Mathematical Equation 1.

The second part PP2' of the second processing line ML2 may be a value obtained in case that the second part PP2 of the first processing line ML1 may be multiplied by K2. K2 may satisfy the following Mathematical Equation 2. The third part PP3' of the second processing line ML2 may be a value obtained in case that the third part PP3 of the first processing line ML1 may be multiplied by K3. K3 may satisfy the following Mathematical Equation 3. The fourth part PP4' of the second processing line ML2 may be a value obtained in case that the fourth part PP4 of the first processing line ML1 may be multiplied by K4. K4 may satisfy the following Mathematical Equation 4.

$$K1 = 2 - (\text{an absolute value of displacement between the first and second processing marks})/(\text{an absolute value of displacement between the first and second panel marks}) \quad \text{[Mathematical Equation 1]}$$

$K2=2-$(an absolute value of displacement between the second and third processing marks)/(an absolute value of displacement between the second and third panel marks)    [Mathematical Equation 2]

$K3=2-$(an absolute value of displacement between the third and fourth processing marks)/(an absolute value of displacement between the third and fourth panel marks)    [Mathematical Equation 3]

$K4=2-$(an absolute value of displacement between the fourth and first processing marks)/(an absolute value of displacement between the fourth and first panel marks)    [Mathematical Equation 4]

The second offset calculated at the step 30 may be reflected such that shapes of the second processing line ML2 in the vicinity of the first to fourth edge points EG1' to EG4' may rotate at a certain angle.

As a result, in case viewed in a plan view, the second processing line ML2 obtained in case that the first processing line ML1 may be reflected with the first offset and the second offset may overlap the outline OUL of the display panel DP.

At a step S50, the processing module MM may process the periphery of the display panel DP along the corrected processing line. For example, the processing module MM may irradiate a laser along the second processing line ML2 to thereby cut the display panel DP.

Figure 14:
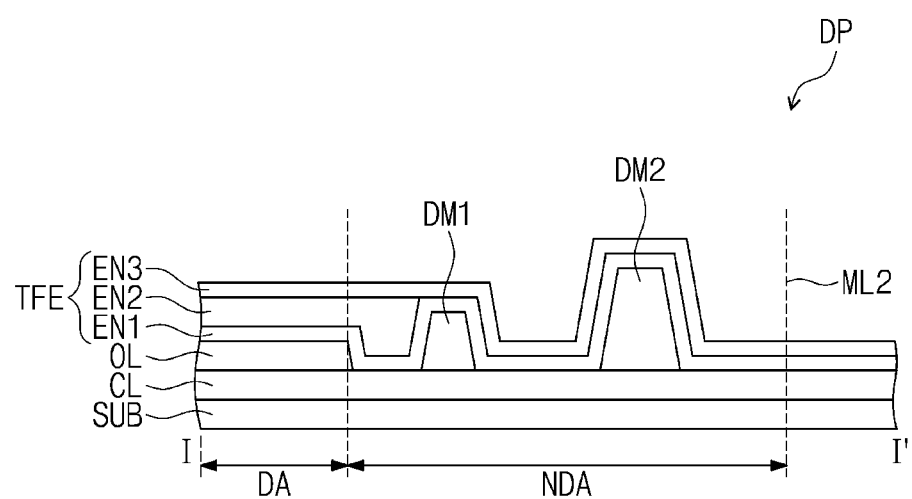
FIG. 14 illustrates a schematic cross-sectional view taken along line I-I' of FIG. 13.

FIG. 14 illustrates a schematic cross-sectional view showing a semiconductor device of FIG. 13.

Referring to FIG. 14, the display panel DP may include at least one dam DM1 and DAM2. In fabricating the display device DD, the dam DM1 and DM2 may suppress an organic material from being externally discharged from the thin-film encapsulation layer TFE. A pre-cured organic material may have fluidity.

The thin-film encapsulation layer TFE may include a first encapsulation layer EN1, a second encapsulation layer EN2, and a third encapsulation layer EN3. The first and third encapsulation layers EN1 and EN3 may include an inorganic material. The second encapsulation layer EN2 may include an organic material. The second encapsulation layer EN2 may be disposed between the first and third encapsulation layers EN1 and EN3.

In an embodiment, the dam DM1 and DM2 may include a first dam DM1 and a second dam DM2. The first and second dams DM1 and DM2 may be disposed on the circuit element layer CL. The first and second dams DM1 and DM2 may overlap the non-display region NDA. The second dam DM2 may be more widely spaced apart than the first dam DM1 from the display region DA. No limitation is imposed on the number of the dams DM1 and DAM2.

In case viewed in cross-section, the second encapsulation layer EN2 may extend from the display region DA to but not beyond a lateral surface of the first dam DAM1. The first and third encapsulation layers EN1 and EN3 may extend from the display region DA toward the non-display region NDA. The first and third encapsulation layers EN1 and EN3 may be disposed on the first and second dams DM1 and DAM2.

In case that the display device DD may be fabricated, the first dam DM1 may prevent flow of an organic material of the second encapsulation layer EN2, and the second dam DM2 may prevent the organic material to overflow the first dam DAM1.

The second processing line ML2 along which the display panel DP may be cut may be defined outside the second dam DAM2. In case that the second processing line ML2 may be defined inside the first dam DM1 or defined between the first and second dams DM1 and DAM2, defects (e.g., a crack) may occur in the display panel DP that has been cut.

In contrast, in a method of fabricating a display device according to an embodiment of the disclosure, the position of the second processing line ML2 may be corrected in consideration of the degree of deformation around multiple edge portions of the display panel DP, such that the corrected second processing line ML2 may be defined outside the second dam DM2 disposed on an outermost portion of the display panel DP, with the result that the display panel DP may be cut along the corrected second processing line ML2 and thus be prevented from being damaged during the cutting procedure.

In particular, because the corrected second processing line ML2 may be reflected not only with the displacement at multiple positions, but with the degree of inclination, the corrected second processing line ML2 may be quite appropriate for an actual shape of the display panel DP.

In a method of fabricating a display device according to an embodiment of the disclosure, the periphery of a display panel may be processed based on a second processing line that reflects deformation of the display panel after experiencing an annealing process, and thus it may be possible to precisely perform a cutting process.

Although the invention is described in conjunction with example embodiments thereof, it would be understood by those skilled in the art that the embodiments can be modified or changed in various ways without departing from the spirit and scope of the inventive concepts defined by the appended claims and equivalents thereof. Further, the embodiments disclosed herein are not intended to limit the technical spirit of the invention and all modifications within the claims and their equivalents should be construed as being included in the invention.

What is claimed is:

1. A method of fabricating a display device, the method comprising:
   providing a substrate that includes a display panel, the display panel including a panel mark;
   placing a processing module on the display panel, the processing module including a processing mark and a first processing line adjacent to the processing mark, the processing mark corresponding to the panel mark of the display panel;
   calculating an offset in a plan view between the panel mark and the processing mark;
   correcting the first processing line to define a second processing line that overlaps a periphery of the display panel, the correcting including reflecting the calculated offset; and
   processing the periphery of the display panel along the second processing line,
   wherein the calculating of the offset includes:
      determining a position of a first point of the processing mark and a position of a second point of the panel mark, the second point corresponding to first point;
      obtaining a first offset defined as a displacement between the positions of the first point and the second point; and
      obtaining a second offset defined as an angle of the panel mark with respect to the processing mark.

2. The method of claim 1, wherein each of the panel mark and the processing mark is provided in plural.

3. The method of claim 2, wherein the panel mark includes:
   a first panel mark defined adjacent to a first edge point of the display panel;

a second panel mark defined adjacent to a second edge point of the display panel, the second panel mark being spaced apart in a first direction from the first edge point;

a third panel mark defined adjacent to a third edge point of the display panel, the third panel mark being spaced apart in a second direction from the second edge point, the second direction intersecting the first direction; and a fourth panel mark defined adjacent to a fourth edge point of the display panel, the fourth panel mark being spaced apart in the second direction from the first edge point, the fourth edge point and the third edge point facing each other in the first direction.

4. The method of claim 1, wherein the obtaining of the first offset includes:

acquiring a displacement along an X-axis of the second point from the first point; and acquiring a displacement along a Y-axis of the second point from the first point, the Y-axis intersecting the X-axis.

5. The method of claim 1, wherein the processing mark includes a first horizontal part that extends in a first direction, and the panel mark includes a second horizontal part that extends in the first direction, wherein the obtaining of the second offset includes measuring an angle of the second horizontal part with respect to the first horizontal part.

6. The method of claim 1, wherein the display panel includes:

a cell substrate having a display region and a non-display region adjacent to the display region;

a circuit element layer on the cell substrate, the circuit element layer overlapping the display region and the non-display region;

a display element layer on the circuit element layer, the display element layer overlapping the display region; and at least one dam on the circuit element layer, the at least one dam overlapping the non-display region, wherein the second processing line is more widely spaced apart than the at least one dam from the display region in a plan view.

7. The method of claim 1, wherein the substrate includes a plurality of display panels disposed in a first direction and a second direction that intersects the first direction.

8. The method of claim 1, wherein the processing module irradiates a laser along the second processing line to separate the display panel from the substrate.

9. The method of claim 1, wherein an area within the first processing line is different from an area within the second processing line in a plan view.

10. The method of claim 1, further comprising performing an annealing process on the substrate before the providing of the substrate.

11. The method of claim 1, wherein the display panel includes a flexible substrate.

12. A method of fabricating a display device, the method comprising:

placing a display panel on a first processing region including a first axis and a second axis that intersects the first axis, the display panel including a panel mark;

calculating a displacement in a plan view along the first axis of the panel mark with respect to a processing mark defined in the first processing region, and a displacement in a plan view along the second axis of the panel mark with respect to the processing mark;

calculating an angle in a plan view between the panel mark and the processing mark;

correcting the first processing region into a second processing region, the correcting including reflecting the displacement along the first axis, the displacement along the second axis, and the angle; and processing a periphery of the display panel along a boundary of the second processing region.

13. The method of claim 12, wherein each of the panel mark and the processing mark is provided in plural.

14. The method of claim 13, wherein the plural panel marks are defined adjacent to a plurality of edge points of the display panel, and the plural processing marks are defined adjacent to a plurality of edge points of the first processing region.

15. The method of claim 12, wherein the panel mark includes a horizontal part parallel to the first axis.

16. The method of claim 12, wherein the display panel includes:

a cell substrate having a display region and a non-display region adjacent to the display region; and at least one dam on the non-display region, wherein the boundary of the second processing region is more widely spaced apart than the at least one dam from the display region in a plan view.

* * * * *